United States Patent
Krishnan et al.

(10) Patent No.: US 6,630,376 B1
(45) Date of Patent: Oct. 7, 2003

(54) BODY-TIED-TO-BODY SOI CMOS INVERTER CIRCUIT

(75) Inventors: Srinath Krishnan, Campbell, CA (US); Jerry G. Fossum, Gainesville, FL (US); Meng-Hsueh Chiang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/284,839

(22) Filed: Oct. 31, 2002

Related U.S. Application Data

(62) Division of application No. 09/919,543, filed on Jul. 31, 2001, now Pat. No. 6,498,371.

(51) Int. Cl.[7] .......................................... H01L 21/8238
(52) U.S. Cl. ....................................... 438/199; 438/479
(58) Field of Search ................................. 257/347, 348, 257/349, 351; 438/154, 158, 199, 479, 517, 967, 217

(56) References Cited

U.S. PATENT DOCUMENTS

| | | | |
|---|---|---|---|
| 5,573,969 A | * 11/1996 | Kim ........................... 438/224 |
| 5,693,975 A | * 12/1997 | Lien ........................... 257/374 |
| 5,914,515 A | 6/1999 | Fukumoto et al. .......... 257/351 |
| 6,429,492 B1 | * 8/2002 | Rockett ....................... 257/368 |
| 6,456,157 B1 | * 9/2002 | Forbes et al. ............... 327/543 |

FOREIGN PATENT DOCUMENTS

WO     99/33115     7/1999

OTHER PUBLICATIONS

Chapter 2 entitled "Cmos Fabrication Technology And Design Rules" of Design of VLSI Systems; pp. 1–16.
What is SOI—Silicon Genesis—SiGen Corp.

* cited by examiner

*Primary Examiner*—Long Pham
*Assistant Examiner*—Hoai Pham
(74) *Attorney, Agent, or Firm*—Renner, Otto, Boisse-le & Sklar

(57) ABSTRACT

An SOI CMOS inverter circuit in which a silicide layer in combination with body tie regions tie a p-type body region and an n-type body region together. At the same time, however, the body regions remain floating electrically so that the benefits of SOI are maintained. The silicide layer permits excess carriers to be recombined via the respective body regions so that the body region potential does not get modulated by generation/recombination effects. Thus, a hysteresis effect in the inverter circuit will be reduced.

10 Claims, 3 Drawing Sheets

BODY-TIED-TO-BODY SOI CMOS INVERTER CIRCUIT

This is a division of application Ser. No. 09/919,543, filed Jul. 31, 2001 now U.S. Pat. No. 6,498,371.

TECHNICAL FIELD

The present invention generally relates to silicon-on-insulator (SOI) technology and, more particularly, to a complementary metal oxide semiconductor (CMOS) inverter for use in SOI circuit design.

BACKGROUND OF THE INVENTION

Complementary metal oxide semiconductor (CMOS) devices that are produced in mass quantities are referred to as "bulk" CMOS. This is because such devices include a semiconductive bulk substrate on which active or passive circuit elements are disposed.

Recently, silicon-on-insulator (SOI) CMOS devices have been introduced which consume less power than do bulk CMOS devices. SOI devices are characterized by a thin layer of insulator material (a so-called buried oxide layer, or "BOX" layer) that is sandwiched between a bulk substrate and an active semiconductor layer. The circuit elements of the device are formed in the active semiconductor layer insulated from the bulk substrate by the BOX layer. Typically, no other layers of material are interposed between the BOX insulator layer and the bulk substrate.

In an SOI CMOS device, the circuit elements in the active semiconductor layer are established by regions which are doped as appropriate with N-type or P-type conductivity dopants. For example, for an N-channel transistor, the active semiconductor layer will include a gate element disposed over a body region having a P-type dopant, with the body region being disposed between a source region and a drain region, each of which are doped with an N-type dopant. These devices provide an important advantage in many applications such as battery-powered mobile telephones and battery-powered laptop computers. Also, SOI CMOS devices advantageously operate at higher speeds than do bulk CMOS devices. SOI CMOS architecture eliminates inherent parasitic circuit elements in bulk CMOS due to junction capacitances between adjacent components. Also, CMOS circuits are very fast, due to the fact that the bulk capacitance is very small. SOI CMOS is also immune to latchup.

Problems surrounding the technology include the SOI floating-body effect. This particular problem has been addressed by others, by example, in a paper entitled "Suppression of the SOI Floating-body Effects by Linked-Body Device Structure," by W. Chen, et. al., 1996 Symposium on VLSI Technology Digest of Technical Papers.

The core of CMOS circuit designs is an inverter circuit consisting of a linked pair of complementary transistors. A CMOS integrated circuit may literally include millions of such inverters. Unfortunately, the aforementioned floating-body effect has been found to affect detrimentally the operation of an inverter circuit. For example, excess carriers within the complementary transistors tend to accumulate due to the floating body. As a result, the output of the inverter circuit has been found to exhibit a hysteresis effect. Such hysteresis is problematic in that it can reduce significantly the acceptable switching rate of the device, for example.

In view of the aforementioned shortcomings associated with CMOS inverter circuits in SOI devices, there exists a strong need in the art for an SOI CMOS inverter circuit which exhibits reduced hysteresis effects. More generally, there is a strong need in the art for an SOI CMOS inverter circuit which is less susceptible to detrimental operation due to the floating-body.

SUMMARY OF THE INVENTION

In accordance with one aspect of the invention, a semiconductor-on-insulator (SOI) inverter circuit is provided. The inverter circuit includes a bulk substrate, an insulator layer formed on a surface of the substrate, an active semiconductor layer formed on a surface of the insulator layer opposite the substrate, a p-type body region and an n-type body region formed generally adjacent one another in the active semiconductor layer, an n-channel metal-on-semiconductor field effect transistor (MOSFET) formed in the p-type body region and a p-channel MOSFET formed in the n-type body region, wherein a gate of each of the n-channel MOSFET and the p-channel MOSFET are electrically coupled to form an input of the inverter circuit and a drain of each of the n-channel MOSFET and the p-channel MOSFET are electrically coupled to form an output of the inverter, a p-type body tie region formed in the active semiconductor layer immediately adjacent the p-type body region and an n-type body tie region formed in the active semiconductor layer immediately adjacent the n-type body region; and an electrically conductive element electrically coupling the p-type body tie region to the n-type body tie region.

In accordance with another aspect of the invention, a method of manufacturing a semiconductor-on-insulator (SOI) inverter circuit is provided. The method includes the steps of forming an insulator layer on a surface of a bulk substrate, forming an active semiconductor layer on a surface of the insulator layer opposite the substrate, forming a p-type body region and an n-type body region generally adjacent one another in the active semiconductor layer, forming an n-channel metal-oxide-semiconductor field effect transistor (MOSFET) in the p-type body region and a p-channel MOSFET in the n-type body region, wherein a gate of each of the n-channel MOSFET and the p-channel MOSFET are electrically coupled to form an input of the inverter circuit and a drain of each of the n-channel MOSFET and the p-channel MOSFET are electrically coupled to form an output of the inverter, forming a p-type body tie region in the active semiconductor layer immediately adjacent the p-type body region and an n-type body tie region in the active semiconductor layer immediately adjacent the n-type body region, and providing an electrically conductive element electrically coupling the p-type body tie region to the n-type body tie region.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

Figure 1:
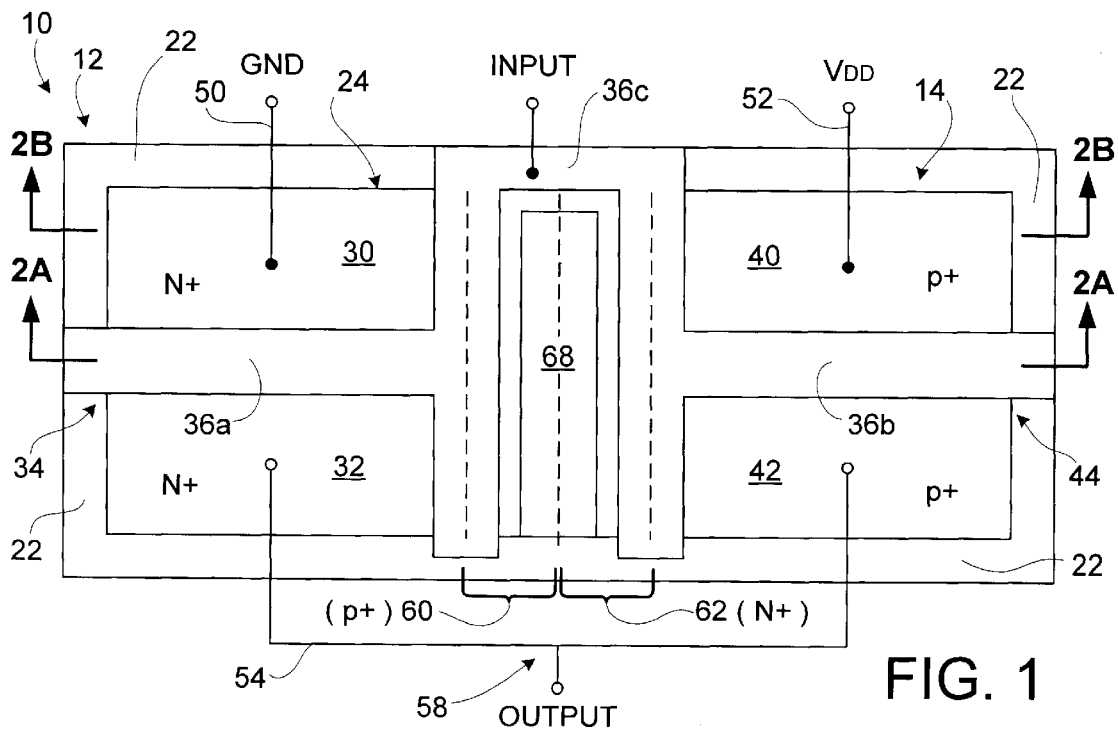
FIG. 1 is a top plan view of an SOI CMOS inverter circuit in accordance with the present invention.

The present invention will now be described with reference to the drawings, wherein like reference numerals are used to refer to like elements throughout.

Figure 2A:
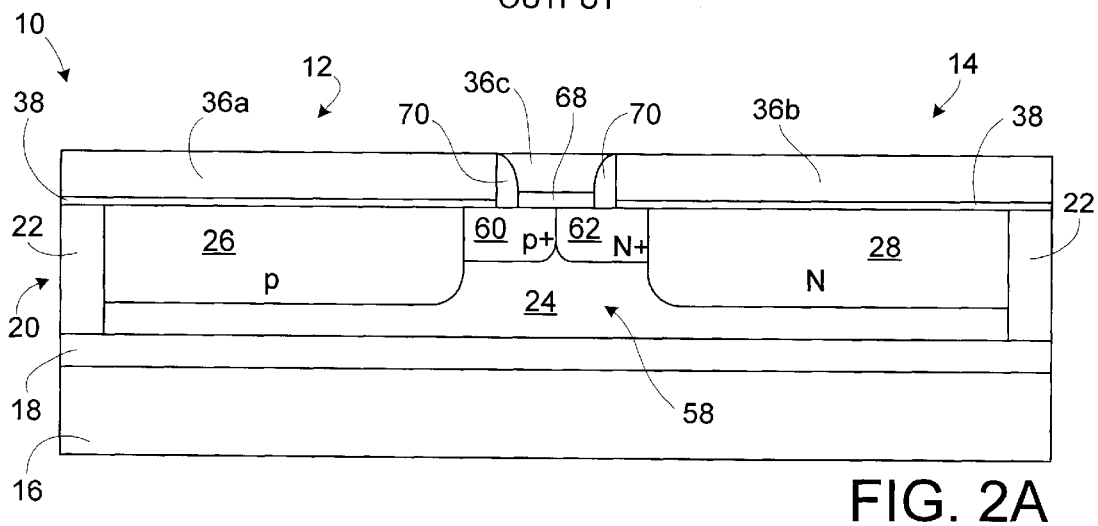
FIG. 2A is a cross sectional view of the inverter circuit of FIG. 1 taken along line 2A—2A in accordance with the present invention.
Figure 2B:
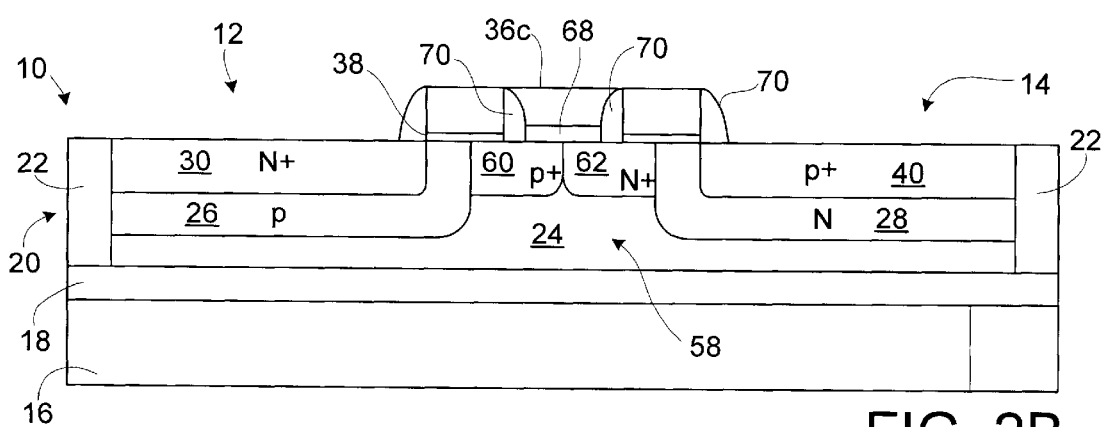
FIG. 2B is a cross sectional view of the inverter circuit of FIG. 1 taken along line 2B—2B in accordance with the present invention.

Referring initially to FIGS. 1, 2A and 2B, an SOI CMOS inverter circuit 10 is shown in accordance with the present invention. The inverter circuit 10 includes a linked pair of complementary transistors 12 and 14. Transistor 12 is a partially depleted (PD) n-channel transistor. Transistor 14 is a PD p-channel transistor.

As is shown in FIGS. 2A and 2B, the inverter circuit 10 is formed in a conventional SOI structure including a bulk substrate 16. The bulk substrate 16 is typically silicon, but could be some other type of material such as gallium arsenide, glass, quartz, etc. An insulator layer 18, such as a buried oxide (BOX) layer, is formed on a surface of the bulk substrate 16. An active semiconductor layer 20 is formed on a surface of the insulator layer 18 opposite the bulk substrate 16. The active semiconductor layer 20 is typically silicon, but could be some other type semiconductor material without departing from the scope of the invention.

An isolation barrier 22 is provided in the active semiconductor layer 20. The isolation barrier 22 defines an active region 24 within the active semiconductor layer 20 in which the inverter circuit 10 is formed. Typically, the isolation barrier 22 is formed of a shallow trench isolation (STI) barrier as is known. The isolation barrier 22 in combination with the insulator layer 18 isolate the active region 24 such that the active region 24 electrically "floats" relative to the bulk substrate 16.

The active region 24 includes a p-doped, or p-type body region 26 in which the n-channel transistor 12 is formed. In addition, the active region 24 includes an n-doped, or n-type body region 28 in which the p-channel transistor 14 is formed.

The n-channel transistor 12 includes n$^+$-doped source and drain regions 30 and 32, respectively, formed in the p-type body region 26 with a channel region 34 therebetween as shown in FIG. 1. A gate 36a is disposed above the channel region 34 with a gate oxide layer 38 disposed between the channel region 34 and the gate 36a.

Similarly, the p-channel transistor 14 includes p$^+$-doped source and drain regions 40 and 42, respectively, formed in the n-type body region 28 with a channel region 44 therebetween. A gate 36b is disposed above the channel region 44 with the gate oxide layer 38 disposed therebetween.

The gates 36a and 36b are electrically coupled to one another via a connecting gate portion 36c and form the INPUT of the inverter circuit 10. The gates 36a, 36b and connecting gate portion 36c may be formed by a common polysilicon layer, as will be appreciated.

As shown in FIG. 1, the inverter circuit 10 includes interconnections 50 and 52 for electrically coupling the source 30 of the n-channel transistor 12 to ground (GND) and the source 40 of the p-channel transistor 14 to a supply voltage ($V_{DD}$), respectively. In addition, the inverter circuit 10 includes an interconnection 54 for electrically connecting the drain regions 32 and 42 of the transistors 12 and 14 together to form the OUTPUT of the inverter circuit 10.

FIGS. 1, 2A and 2B illustrate the manner in which the p-type body region 26 and the n-type body region 28 are located generally adjacent each other in the active region 24. In the exemplary embodiment, however, a small gap 58 exists between the p-type body region 26 and the n-type body region 28. Within the gap 58, a p$^+$-doped body tie region 60 is formed so as to be immediately adjacent (i.e., in contact with) the p-type body region 26. Likewise, an n$^+$-doped body tie region 62 is formed so as to be immediately adjacent the n-type body region 28. Although shown as being in contact with one another in the exemplary embodiment, it will be appreciated that the body tie regions 60 and 62 do not necessarily have to be in physical contact with each other.

The body tie regions 60 and 62 are used in accordance with the present invention to electrically tie the p-type body region 26 and the n-type body region 28 together. For example, a silicide layer 68 is formed at least partially across the top of both the p$^+$-doped body tie region 60 and the n$^+$-doped body tie region 62. The silicide layer 68 is electrically conductive and serves to electrically couple the body tie regions 60 and 62, which in turn electrically ties the p-type body region 26 and the n-type body region 28 together.

The silicide layer 68 may be formed during the same siliciding process carried out with respect to the source and drain regions of the transistors 12 and 14, for example. Alternatively, the silicide layer 68 may be made as part of a different process step. As another alternative, a different electrically conductive element may be substituted for the silicide layer 68. For example, a metal interconnection layer or polysilicon layer used to form the various interconnections or the gate elements may be used. A sidewall spacer 70 (FIGS. 2A and 2B; not shown in FIG. 1) may be provided with respect to the gate portions 36a, 36b and 36c to avoid the silicide layer 68 directly coupling the respective gates to the body tie regions 60 and 62 during manufacture.

As is illustrated in FIG. 2, for example, the silicide layer 68 in combination with the body tie regions 60 and 62 tie the p-type body region 26 and the n-type body region 28 together. At the same time, however, the body regions 26 and 28 remain floating electrically so that the benefits of SOI are maintained. The availability of the silicide layer 68 permits excess carriers to be recombined via the respective body regions so that the body region potential does not get modulated by generation/recombination effects. Thus, the hysteresis effect in the inverter circuit 10 will be reduced. Under AC/transient conditions, however, the inverter circuit 10 still retains the benefit of capacitive coupling and overshoot effects.

Accordingly, the inverter circuit 10 maintains the benefits of partially depleted, SOI technologies while suppressing the effects of hysteresis.

Figure 3:
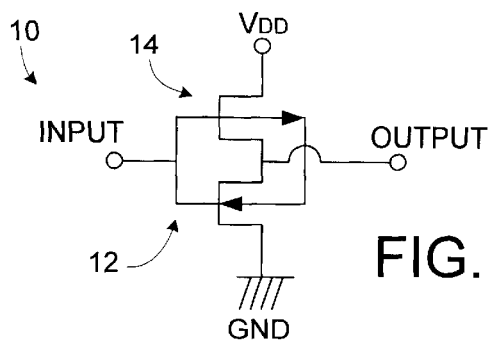
FIG. 3 is a schematic diagram of the inverter circuit in accordance with the present invention.

FIG. 3 presents a schematic diagram of the inverter circuit 10. As is shown, the inverter circuit 10 has a generally conventional CMOS design in the sense that the complementary transistors 12 and 14 are linked between respective supply voltages. As noted in FIG. 3, however, the bodies of the n-channel transistor 12 and the p-channel transistor 14 are electrically tied together within the SOI device.

Figure 4A:
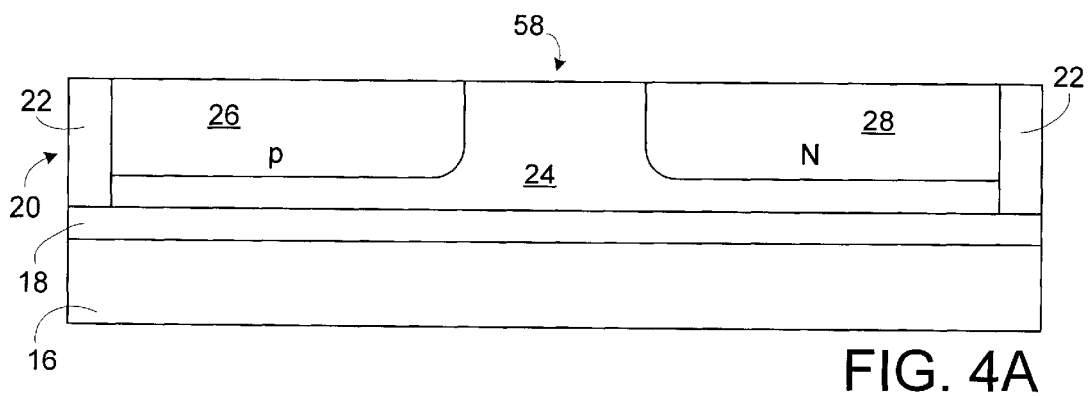
FIGS. 4a, 4b, 4c and 4d are cross sectional views along line 2A—2A of FIG. 1 illustrating various steps in a process for making the inverter circuit in accordance with the present invention.

FIGS. 4a–4d represent in relevant part the steps for manufacturing an inverter circuit 10 (as viewed relative to line 2A—2A in FIG. 1) in accordance with the present invention. As shown in FIG. 4a, a basic SOI structure is formed using conventional techniques. In particular, the bulk substrate 16 is combined with an active semiconductor layer 20 with an insulator layer 18 therebetween. An isolation barrier 22 is formed using conventional STI techniques to define the active region 24. The p-type body region 26 and the n-type body region 28 are formed using known implantation techniques.

Figure 4B:
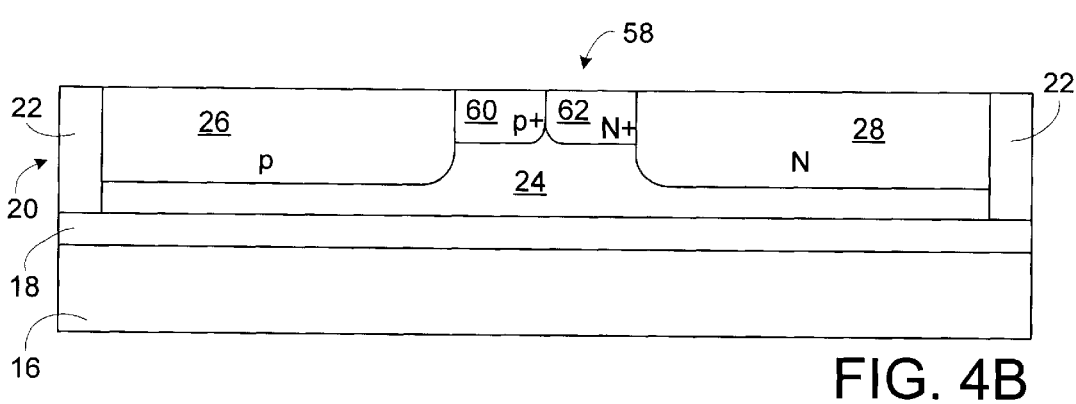

Next, the $p^+$-doped body tie region 60 and the $n^+$-doped body tie region 62 are formed in the gap 58 as shown in FIG. 4b. The body tie regions 60 and 62 may be formed using known implantation techniques with appropriate masking to define the respective regions. It will be appreciated that, in another embodiment, the $p^+$-doped body tie region 60 and the $n^+$-doped body tie region 62 may be formed during the same implantation process in which the source and drain regions of the transistors 14 and 12 are formed, respectively.

Figure 4C:
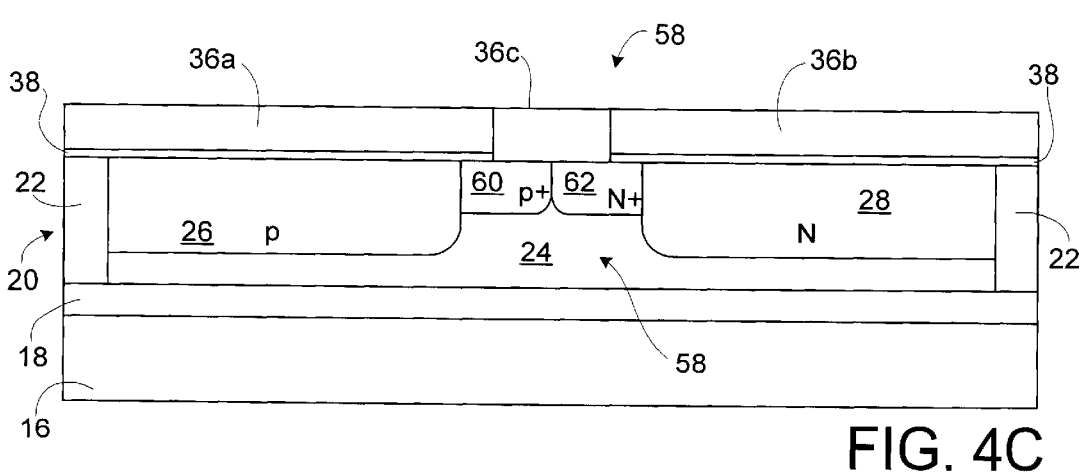

As shown in FIG. 4c, the gate oxide layer 38 is then formed with known techniques at least in those locations where the gate oxide layer 38 is needed to isolate the gates 36a, 36b and portion 36c from the respective channel regions 34 and 44 (FIG. 1). It is noted that the gate oxide layer 38 is not formed on top of the body tie regions 60 and 62 where the silicide layer 68 is to be placed. Alternatively, the gate oxide layer 38 may be formed thereat but subsequently removed.

The gates 36a, 36b and portion 36c are then formed using conventional polysilicon deposition and patterning techniques, for example, as represented in FIG. 4c. Next, the source regions 30,40 and drain regions 32,42 of the transistors 12 and 14 may be created using standard implantation techniques. The gates 36a and 36b may be used as part of a self-aligned masking step in order to define the respective channel regions 34 and 44 between the respective source and drain. The body tie regions 60 and 62 which are otherwise exposed between the gate portion 36c may be masked as needed during formation of the source and drains, and such mask subsequently removed.

Figure 4D:
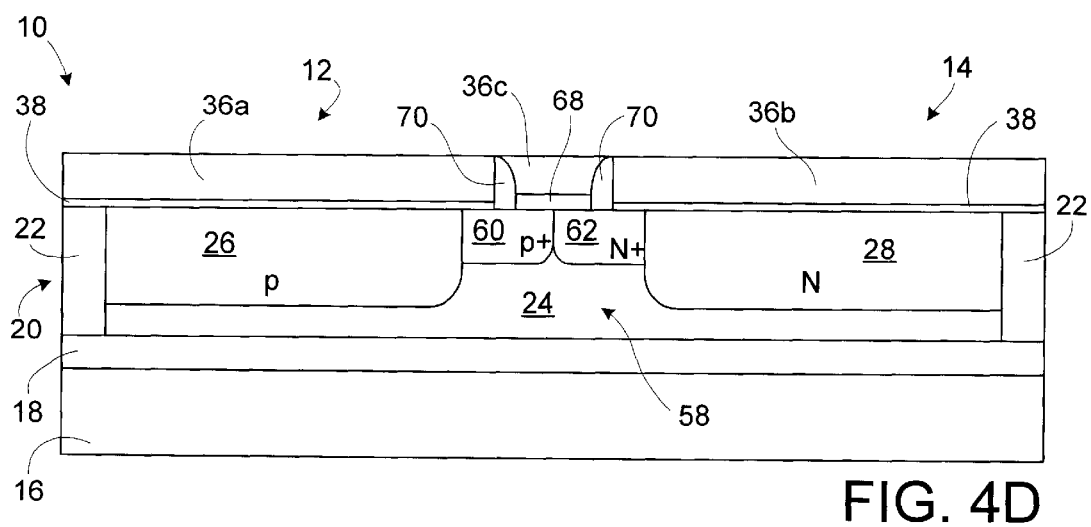

Next, as shown in FIG. 4d, the sidewall spacers 70 are formed along the edge of the gates 36a, 36b and portion 36c at least in the area where the silicide layer 68 is to be formed. As noted above, the sidewall spacers 70 may serve to prevent the silicide layer 68 from shorting the gates to the body regions. Moreover, it will be appreciated that the sidewall spacers 70 may have already been formed as part of a lightly doped drain (LDD) process for forming source and/or drain extensions in the transistors 12 and 14.

The top surfaces of the $p^+$-doped body tie region 60 and the $n^+$-doped body tie region 62 are then silicided to form the silicide layer 68 which ties the body regions 26 and 28 together in accordance with the present invention. As previously indicated, such siliciding may occur as a result of the same siliciding process which is performed on the source and drain regions of the respective transistors. Thereafter, conventional techniques are performed to complete the various interconnections in the inverter circuit 10.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of manufacturing a semiconductor-on-insulator (SOI) inverter circuit, comprising:
    forming an insulator layer on a surface of a bulk substrate;
    forming an active semiconductor layer on a surface of the insulator layer opposite the substrate;
    forming a p-type body region and an n-type body region generally adjacent one another in the active semiconductor layer;
    forming an n-channel metal-oxide-semiconductor field effect transistor (MOSFET) in the p-type body region and a p-channel MOSFET in the n-type body region, wherein a gate of each of the n-channel MOSFET and the p-channel MOSFET are electrically coupled to form an input of the inverter circuit and a drain of each of the n-channel MOSFET and the p-channel MOSFET are electrically coupled to form an output of the inverter;
    forming a p-type body tie region in the active semiconductor layer immediately adjacent the p-type body region and an n-type body tie region in the active semiconductor layer immediately adjacent the n-type body region; and
    providing an electrically conductive element electrically coupling the p-type body tie region to the n-type body tie region.

2. The method of claim 1, wherein the p-type body tie region is a $p^+$-doped region and the n-type body tie region is an $n^+$-doped region.

3. The method of claim 1, wherein the electrically conductive element comprises a silicide layer formed on the active semiconductor layer.

4. The method of claim 3, wherein the silicide layer is also formed on source and drain regions of the n-channel MOSFET and the p-channel MOSFET.

5. The method of claim 1, wherein the electrically conductive element comprises a polysilicon layer formed on the active semiconductor layer.

6. The method of claim 1, wherein the electrically conductive element comprises a metalization layer formed on the active semiconductor layer.

7. The method of claim 1, wherein the p-type body tie region and the n-type body tie region are immediately adjacent one another in the active semiconductor layer.

8. The method of claim 1, wherein the electrically conductive element functions to reduce hysteresis in the output of the inverter.

9. The method of claim 1, further comprising an isolation barrier defining an active region of the active semiconductor layer in which the inverter is formed and electrically isolating the active region from adjacent active regions formed in the active semiconductor layer.

10. The method of claim 9, wherein the isolation barrier comprises a shallow trench isolation (STI) barrier which extends through the active semiconductor layer to the insulator layer.

* * * * *